United States Patent [19]

Tanigawa

[11] Patent Number: 4,741,005
[45] Date of Patent: Apr. 26, 1988

[54] COUNTER CIRCUIT HAVING FLIP-FLOPS FOR SYNCHRONIZING CARRY SIGNALS BETWEEN STAGES

[75] Inventor: Toshiyuki Tanigawa, Itami, Japan

[73] Assignee: Mitsubishi Denki Kabushiki Kaisha, Japan

[21] Appl. No.: 903,953

[22] Filed: Sep. 5, 1986

[30] Foreign Application Priority Data

Sep. 6, 1985 [JP] Japan ................. 60-197992

[51] Int. Cl.⁴ ............... H03K 21/40; H03K 23/44; H03K 23/50
[52] U.S. Cl. ................... 377/115; 377/105; 377/119; 377/28
[58] Field of Search ........... 377/118, 115, 116, 117, 377/119, 106, 111, 104, 105, 25; 307/272 A, 480, 279, 289, 595

[56] References Cited

U.S. PATENT DOCUMENTS

| | | | |
|---|---|---|---|
| 3,354,295 | 11/1967 | Kulka | 377/104 |
| 3,513,329 | 5/1970 | Washizuka et al. | 377/105 |
| 3,943,378 | 3/1976 | Beutler | 377/117 |
| 4,495,629 | 1/1985 | Zasio et al. | 307/272 A |
| 4,587,665 | 5/1986 | Minakuchi | 377/116 |

OTHER PUBLICATIONS

"Asynchronous Binary 2n Coded Counter", Suzuki et al, *Technical Dictionary of Pulse Circuits*, 1980, p. 470.

Primary Examiner—John S. Heyman
Attorney, Agent, or Firm—Leydig, Voit & Mayer

[57] ABSTRACT

A multistage counter circuit comprising a plurality of counters connected in cascade, each providing a carry signal and having signal logic levels at an output of each stage inverted by main clock pulses and sub clock pulses, and means including a flip-flop connected at the output of each stage for synchronizing the carry signal of each stage with the main clock pulses to generate a carry signal to a succeeding stage unafffected by delays in the carry signal of a preceding stage.

3 Claims, 5 Drawing Sheets

COUNTER CIRCUIT HAVING FLIP-FLOPS FOR SYNCHRONIZING CARRY SIGNALS BETWEEN STAGES

BACKGROUND OF THE INVENTION

This invention relates to a counter circuit. More particularly, it relates to a counter circuit in which a plurality of stages of counters are connected in cascade and have their signal logic levels inverted using main clock pulses and sub clock pulses.

FIG. 1 is a circuit diagram showing the arrangement of a prior-art counter circuit. Referring to the figure, numerals 1, 2, 3, 5 and 6 designate main clock signal lines which are respectively supplied with a main clock signal, numerals 8, 9 and 10 sub clock signal lines which are respectively supplied with a sub clock signal, and numerals 11, 12, 13, 14, 15, 16, 17, 18, 19, 20, 22, 23, 24, 25, 26 and 27 signal lines. The arrangement further includes buffers 30, 36 and 44, transfer gates (hereinbelow, simply written as "gates") 31, 33, 34, 37, 39, 42, 43, 45 and 47, inverters 32, 38 and 46, and AND gates 40 and 48.

In FIG. 1, a circuit formed of the parts 30, 13, 31, 14, 32, 15, 33 and 12 constructs a counter of the first stage, a circuit formed of the parts 36, 17, 37, 18, 38, 19, 39 and 20 constructs a counter of the second stage, and a circuit formed of the parts 44, 24, 45, 25, 46, 26, 47 and 27 constructs a counter of the third stage. Within an extent illustrated in FIG. 1, a binary counter of three stages is constructed. The parts 34, 40, 42 and 48 construct interstage coupling circuits.

Since the counters of the respective stages are structurally similar to one another, the mutually corresponding points thereof shall be respectively assigned common designations. In this specification, the parts 14, 18 and 25 shall be termed the 'first points', the parts 12, 20 and 27 and 'second points', and the parts 13, 17 and 24 the 'third points'. The logic level of the third point is transferred to the first point by the main clock pulse, while the logic level of the first point is inverted by the inverter and the inverted level is transferred to the second point by the sub clock pulse. Signal transfer from the second point to the third point concerns a carry from the preceding stage, and will be described later.

Next, the operation of the circuit shown in FIG. 1 will be described. FIG. 2 is a time chart showing the operation of the circuit illustrated in FIG. 1. In FIG. 2, the axis of abscissas represents the time, and the voltage waveforms of the various signal lines depicted in FIG. 1 are vertically indicated by the same reference numerals. Since the voltage waveforms of the signal lines 15 and 19 are the inverted waveforms of those of the signal lines 14 and 18 respectively, they are omitted. The signal on the signal line 1 is the main clock pulses, while the signal on the signal line 8 is the sub clock pulses, and they have periods equal to each other. In the illustrated embodiment, the main clock pulse and the sub clock pulse have a phase difference equal to a half cycle. The phase difference, however, need not always be the half cycle, but can be set at any desired value within the limits in which the main clock pulse and the sub clock pulse do not overlap.

At a time $t_1$, the respective signal lines are in the state of FIG. 2 in which all the first points, namely, the signal lines 14, 18 and 25 (the signal on the line 25 is not shown) of the counters of the respective stages are of logic "1" while the signal lines at other points are of logic "0". The logic "1" state of the signal lines 14, 18, and 25 is generated in the circuit of FIG. 1 upon operation of the counter circuit and is set as an initial state. For simplicity, only the states of signal lines 14 and 18 are illustrated, and, therefore, the states of signal lines of the third counter are omitted. When, at a time $t_2$, the main clock pulse is impressed to enable the gates 31, 37, and 45 the logic levels on the first points or the signal lines 14, 18, and 25 become the same as the logic levels on the third points or the signal lines 13, 17, and 24 respectively. Since the states of the signal lines 13, 17, and 24 are of logic "0" at this time, the logic levels on the signal lines 14, 18, and 25 are changed and become "0". The logic levels on the signal lines 15, 19, and 26 become "1", but, since the gates 33, 39, and 47 have not been enabled, the logic levels on the signal lines 12, 20, and 27 remain in the previous state, namely, logic level "0". As a result, the logic level on the signal line 13 remains at "0", while the logic levels on the signal lines 17 and 24 are at "0" due to the disablement of the gates 34 and 42. However, at a time $t_4$ when the main block is "0" and the sub clock becomes "1" to enable the gates 33, 39, and 47, the logic levels on the second points or the signal lines 12, 20, and 27 take the logic level "1" of the signal lines 15, 19, and 26, respectively, to become the inverted levels of the logic level on the first points or the signal lines 14, 18, and 25. As a result, the logic level on the signal line 13 is changed from "0" to "1", but the logic level on the signal lines 16 and 23 remain unchanged because the gates 34 and 42 are disabled by the logic "0" of the signal lines and 14 and 18, respectively. Since the main clock pulses on the signal lines 1, 3, and 6 remain at "0", the logic elevels on lines 14, 18, and 25 are not changed and remain at "0". At a time $t_6$, the main block is "1" and the gates 31, 37, and 45 are once again enabled. However, only the logic level on the signal line 14 changes to "1" due to the high logic level on the signal line 13. The logic levels on the signal lines 18 and 25 remain unchanged at "0" due to the low logic levels on signal lines 17 and 24. At a time $t_8$, the operation is repeated as at the time $t_4$, namely, the sub clock becomes "1" to enable the gates 33, 39, and 47. The logic levels on the signal lines 12, 20, and 27 become the inverted level of the logic levels on the signal lines 14, 18, and 25 and the logic level on the signal line 13 becomes the same as the logic level on the signal line 12. However, since the gate 35 is disabled and the gate 39 is enabled, the logic level on the signal line 17 becomes the inverted level of the logic level on the signal line 18.

In this way, the values of the respective signal lines are successively changed with time. When the logic levels on the first points or the signal lines 14 and 18 in the respective counters are considered as count values, these values change as "00", "01", "10" and "11". Since the succeeding stage may be enabled only in the case of the value "11", a signal obtained by passing the carry signal (14) of the first stage and the output signal (18) of the second stage through the AND gate 40 can be utilized as the carry signal of the third stage. That is, in the case of the multistage counter circuit, the carry signal of the preceding stage and the output signal of the particular stage are passed through the AND gate, and the resulting signal is utilized as the carry signal of the succeeding stage. In other words, the counter circuit is controlled so that the gate 34 may fall into the ON state at the count phase immediately before the carry at which the carry pulse is delivered from the preceding stage, namely, at the count phase "01" or "11" and that the gate 42 may fall into the ON state at the count phase immediately before the carry at which the carry pulse is delivered from the preceding stage, namely, at the count phase "11".

In the prior-art counter circuit as stated above, the carry signal of the preceding stage and the output signal of the particular stage are passed through the AND gate 10 and then utilized as the carry signal of the succeeding stage. This has led to the problem that, as shown in FIG. 3, delays in the carry signal 14 of the preceding stage and in the output signal 18 of a particular stage incurs an error in the carry signal 22 of the succeeding stage and therefore, the counter circuit is incorrectly operated.

SUMMARY OF THE INVENTION

This invention has the objective to solve such a problem, and has for its main object to provide a multistage counter circuit which causes no error in the carry signal even when delays in the carry signals of preceding stages occur.

The counter circuit according to this invention includes means for generating a signal in synchronism with a sub clock pulse directly before the carry signal of a preceding stage is latched in a flip-flop by a main clock pulse, and that the output of the flip-flop is utilized as the carry signal of a succeeding stage.

In this invention, since the delays in the carry signals of preceding stages are connected by the synchronism of the flip-flop, no error appears in the carry signal and the counter circuit is accurately operated.

BRIEF DESCRIPTION OF THE DRAWINGS

In the drawings, the same symbols indicate identical or corresponding portions.

DESCRIPTION OF THE PREFERRED EMBODIMENTS

Now, embodiments of this invention will be described with reference to the drawings.

Figure 1:
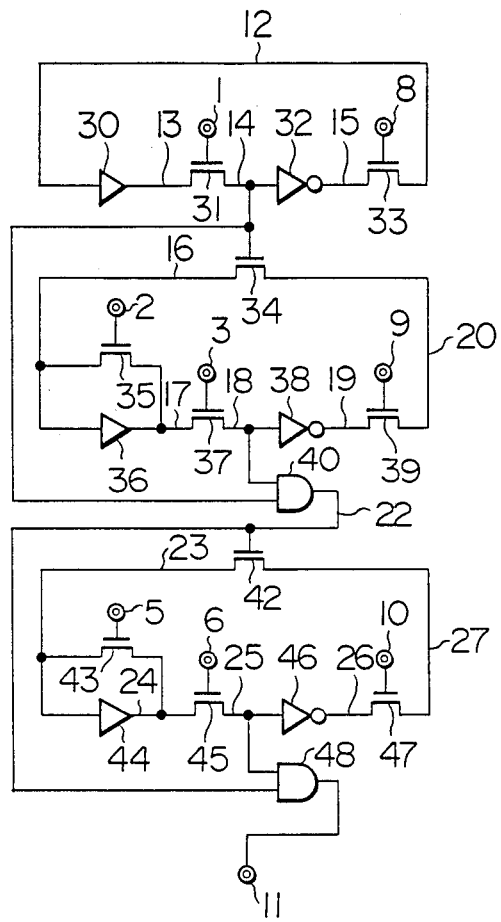
FIG. 1 is a circuit diagram showing the arrangement of a prior-art counter circuit.
Figure 2:
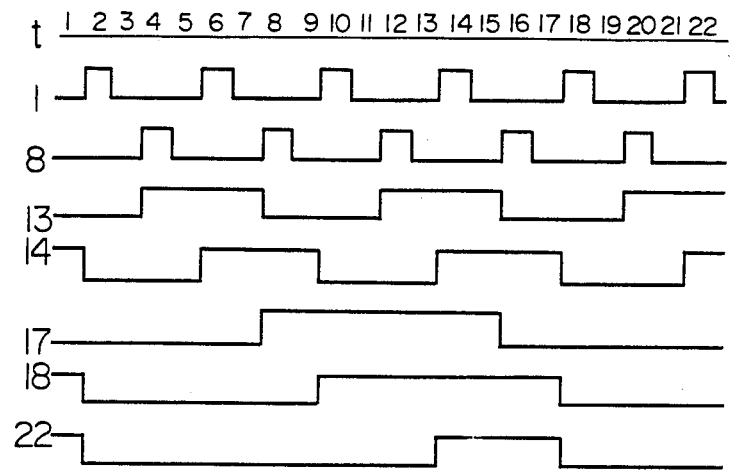
FIGS. 2 and 3 are time charts illustrative of the operations of the circuit shown in FIG. 1.
Figure 3:
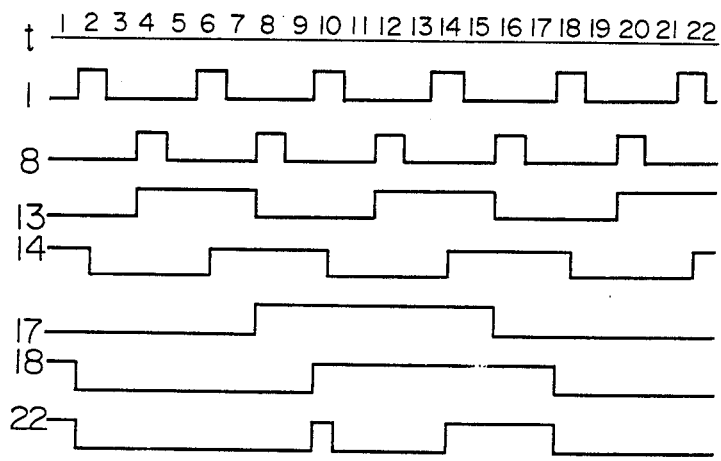
Figure 4:
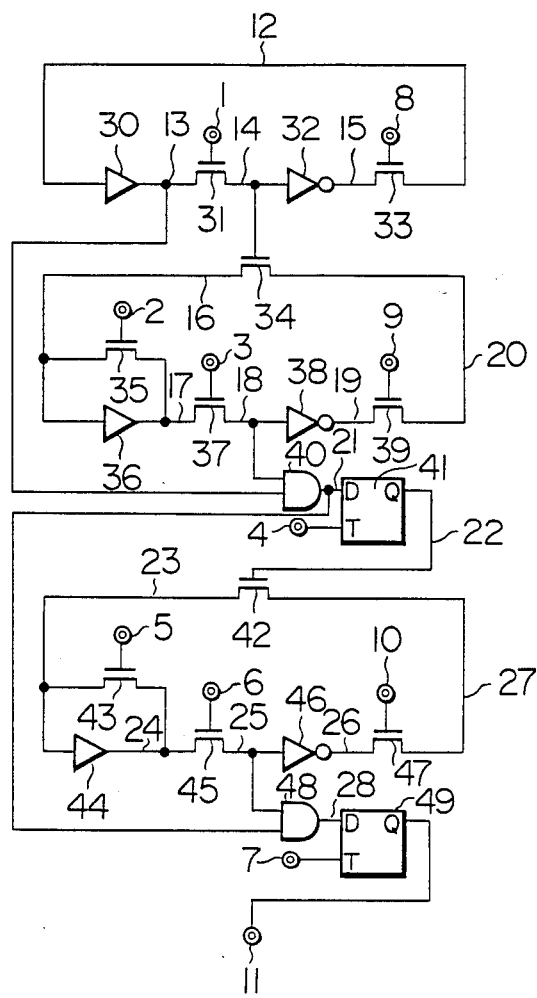
FIG. 4 is a circuit diagram showing an embodiment of this invention.
Figure 5:
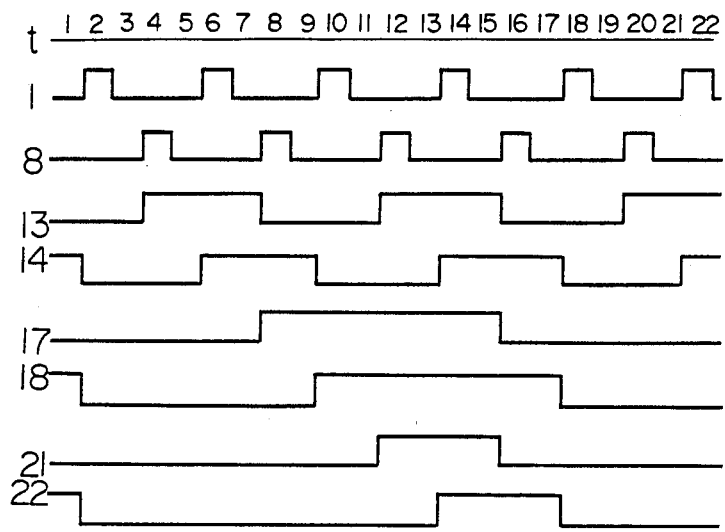
FIGS. 5 and 6 are time charts of the circuit shown in FIG. 4.
Figure 6:
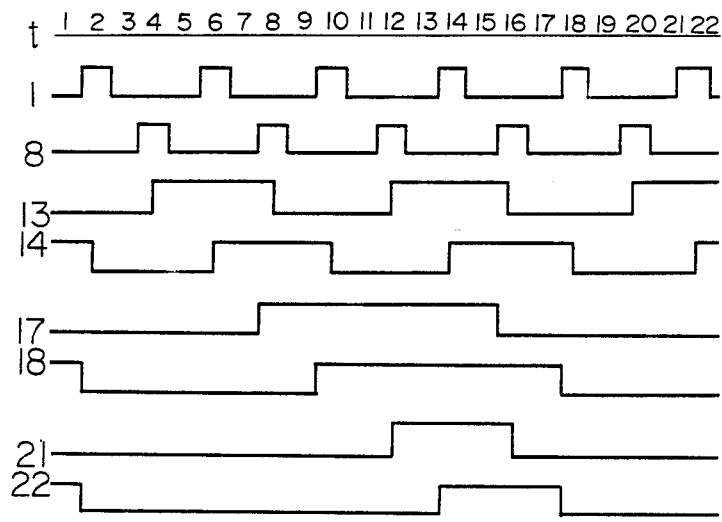

FIG. 4 is a circuit diagram showing one embodiment of this invention, in which the same symbols as in FIG. 1 indicate identical or corresponding portions. Besides, numerals 4 and 7 indicate main clock signal lines, numerals 21 and 28 signal lines, and numerals 41 and 49 D-type flip-flops. In addition, FIGS. 5 and 6 are time charts of the circuit shown in FIG. 4. In each of the time charts, the axis of abscissas represents the time, and the voltage waveforms of the various signal lines depicted in FIG. 4 are vertically indicated by the same reference numerals. The voltage waveforms of the signal lines 15 and 19 are omitted since the states thereof are the inverted waveforms of the voltage waveforms of the signal lines 14 and 18, respectively. In FIG. 5, as in FIG. 2 showing the prior art, the state of a time $t_1$ is the state in which all the logic levels of the first points of the counters of the respective stages, namely, the logic levels on the signal lines, 14, 18, . . . are "1", that is, the initial state.

During a period from the time $t_1$ to a time $t_{11}$, the operations of the embodiment are similar to those of the prior-art circuit. During a period from a time $t_{12}$ to a time $t_{15}$, both the logic levels on the signal line 13 and the signal line 18 are "1", and the logic level on the signal line 21 being the output of the AND gate 40 is "138 . As a carry signal for the third stage, a signal "1" is required in the period from the time $t_{14}$ to a time $t_{17}$ during which both signal lines 14 and 18 are of "1". Accordingly, the signal of the signal line 21 is applied to the D-type flip-flop 41 and latched therein in synchronism with the main clock signal, and the latched signal is derived as the signal of the signal line 22. Thus, the signal on the signal line 22 becomes "1" during the period from the time $t_{14}$ to the time $t_{17}$ and can be employed as the carry signal of the third stage.

FIG. 5 illustrates a case where the signal on the signal line 14 (namely, the signal of the first point of the first-stage counter) is not delayed with respect to the signal on the signal line 18 (namely, the signal of the first point of the second-stage counter). FIG. 6 shows the signals similar to those in FIG. 5, but it illustrates a case where the signal on the signal line 14 is delayed with respect to the signal on the signal line 18, so the hazard appears in the prior-art circuit. According to this invention, even in the case of FIG. 6, the signal (on the signal line 22), which is obtained in such a way that the signal on the signal line 21 is latched in the D-type flip-flop 41 by the main clock pulse, is synchronized with the main clock pulse and involves no delay, and it does not cause the hazard as in the output of the AND gate 40 in FIG. 1.

Figure 7:
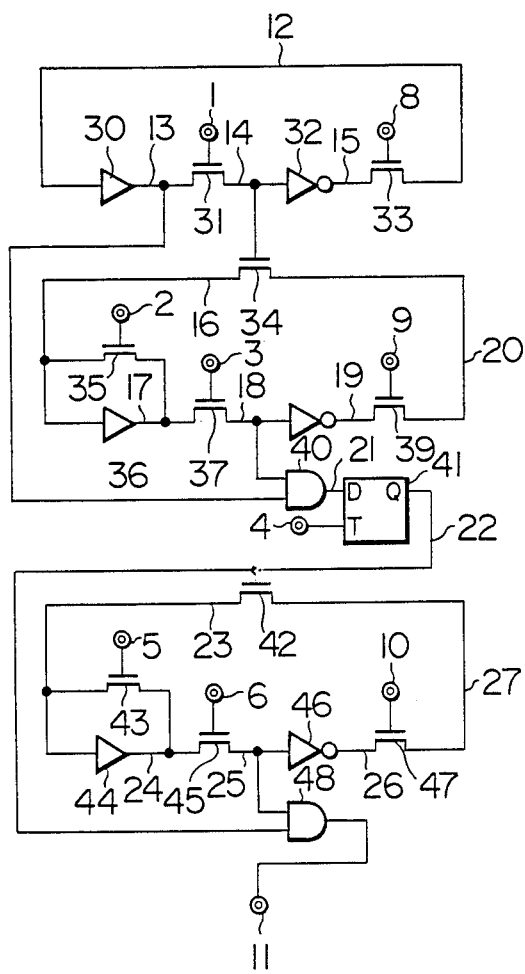
FIG. 7 is a circuit diagram showing another embodiment of this invention.

This invention can also be performed by employing the circuits of FIG. 4 for the first and second stages and the circuit of FIG. 1 for the third stage as in an embodiment shown in FIG. 7.

As explained above, according to this invention, the carry signal of a particular stage is not the carry signal of a preceding stage, but it is a signal obtained in such a way that a signal synchronous with a sub clock pulse directly before the carry signal of the preceding stage is latched in a D-type flip-flop by a main clock pulse. This produces the effect that no hazard appears in the carry signal, so a malfunction ascribable to the hazard can be prevented from occurring.

What is claimed is:

1. A multistage circuit comprising a plurality of counting stages connected in cascade, each providing a carry signal and having signal logic levels at an output of each counting stage inverted by main clock pulses and sub clock pulses; and means including a flip-flop connected at the output of each counting stage except the first stage to receive the carry signal from that counting stage and the carry signal from a preceding counting stage and supplied with said main clock pulses for synchronizing the carry signals of that counting stage and the preceding counting stage with the main clock pulses to generate a carry signal to said flip-flop means of a succeeding counting stage unaffected by delays in the carry signal of the preceding counting stage.

2. A multistage counter circuit employing main clock pulses having a predetermined pulse period and sub clock pulses having a pulse period equal to that of the main clock pulses and a predetermined phase difference relative to phases of the main clock pulses comprising a plurality of counting stages connected in cascade, each provided with transfer gates operable in response to the main and sub clock pulses and signal lines connected between said transfer gates to obtain logic levels of said counting stages at a plurality of predetermined points, the signal logic levels at first points in said counting stages being inverted signal logic levels at second points by the operation of the transfer gates in response to the sub clock pulses, the inverted signal logic levels being applied directly to a third point in a first counting stage whereas in subsequent counting stages the inverted signal logic levels at second points are transferred to third points in response to the operation of the transfer gates connected therebetween, the signal logic levels at the third points being applied to the first points by the operation of the transfer gates in response to the main clock pulses, each of said counting stages further providing a carry signal indicative of a carry state of corresponding counting stages;

means including a flip-flop and an AND gate connected at the first point of each of said subsequent counting stages for synchronizing the carry signal of each stage with the main clock pulses to generate a carry signal to a succeeding stage unaffected by delays in the carry signal of a preceding stage.

3. A multistage counter circuit comprising means providing main clock pulses and sub clock pulses, a plurality of counting stages connected in cascade, each providing a carry signal and having signal logic levels at an output of each counting stage inverted by the main clock pulses and sub clock pulses, and means including a flip-flop connected at the output of each counting stage except the first stage to receive the carry signal from that counting stage and the carry signal from a preceding counting stage and supplied with said main clock pulses for synchronizing the carry signals of that counting stage and the preceding counting stage with the main clock pulses to generate a carry signal to said flip-flop means a succeeding counting stage unaffected by delay in the carry signal of the preceding counting stage.

* * * * *